United States Patent
Zhang et al.

(10) Patent No.: US 12,401,178 B2
(45) Date of Patent: Aug. 26, 2025

(54) OPENING AND CLOSING MECHANISM AND LEAKAGE PROTECTION DEVICE

(71) Applicant: Schneider Electric (Australia) Pty Ltd, Macquarie Park (AU)

(72) Inventors: Dahai Zhang, Shenzhen (CN); Yonggang Wang, Shenzhen (CN); Qilian Du, Shenzhen (CN); Xin Fan, Shenzhen (CN); Bo Wang, Shenzhen (CN)

(73) Assignee: Schneider Electric (Australia) Pty Ltd, Macquario Park (AU)

( * ) Notice: Subject to any disclaimer, the term of this patent is extended or adjusted under 35 U.S.C. 154(b) by 469 days.

(21) Appl. No.: 17/865,583

(22) Filed: Jul. 15, 2022

(65) Prior Publication Data

US 2023/0021012 A1    Jan. 19, 2023

(30) Foreign Application Priority Data

Jul. 16, 2021    (CN) .......................... 202110808415.1

(51) Int. Cl.
*H02G 3/08*    (2006.01)
*G01R 31/52*    (2020.01)
*H02G 3/12*    (2006.01)

(52) U.S. Cl.
CPC ............. *H02G 3/083* (2013.01); *G01R 31/52* (2020.01); *H02G 3/121* (2013.01)

(58) Field of Classification Search
CPC ........ G01R 31/52; H02G 3/083; H02G 3/121; H01H 71/323; H01H 83/02
See application file for complete search history.

(56) References Cited

U.S. PATENT DOCUMENTS 11,626,264 B1 * 4/2023 Aromin .................. H01H 71/58
                                                    361/93.1
2002/0053066 A1 * 5/2002 Richter ................... G06F 30/20
                                                    716/106

(Continued)

*Primary Examiner* — Timothy J Thompson
*Assistant Examiner* — Rhadames Alonzo Miller
(74) *Attorney, Agent, or Firm* — Troutman Pepper Locke LLP

(57) ABSTRACT

Embodiments of the present disclosure provide an opening and closing mechanism and a leakage protection device. The opening and closing mechanism comprises: a stationary contact and a movable contact, which contacts the stationary contact at ON-position and separates from the stationary contact at OFF-position; a first magnetic assembly; and a second magnetic assembly that is integrally rotatable about an axis, the second magnetic assembly comprising: an electric conductor onto which the movable contact is mounted; and a magnetic body comprising at least one magnetic portion configured to rotate about the axis under a magnetic force from the first magnetic assembly, to correspondingly drive the movable contact to rotate between the ON-position and the OFF-position, wherein a distance from each of the at least one magnetic portion to the axis is smaller than a distance from the movable contact to the axis. In accordance with embodiments of the present disclosure, the transmission efficiency within the opening and closing mechanism may be boosted, and the movable and stationary contacts are separated faster and by a longer distance, so as to improve the performance of the opening and closing mechanism.

13 Claims, 9 Drawing Sheets

(56) References Cited

U.S. PATENT DOCUMENTS

| | | | | |
|---|---|---|---|---|
| 2004/0021996 A1* | 2/2004 | Wu | ............... | H01H 83/04 |
| | | | | 361/42 |
| 2004/0070474 A1* | 4/2004 | Wu | ............... | H01H 83/04 |
| | | | | 361/42 |
| 2004/0070897 A1* | 4/2004 | Wu | ............... | H02H 3/338 |
| | | | | 361/42 |
| 2005/0168308 A1* | 8/2005 | Ward | ............ | H01H 51/01 |
| | | | | 335/229 |
| 2007/0217100 A1* | 9/2007 | Chen | ............ | H01H 1/50 |
| | | | | 361/42 |
| 2010/0259347 A1* | 10/2010 | Ziegler | ......... | H01H 83/04 |
| | | | | 335/14 |
| 2016/0012990 A1* | 1/2016 | Yang | ............ | H01H 33/18 |
| | | | | 218/22 |
| 2019/0041461 A1* | 2/2019 | Reid | ............ | H02H 3/044 |
| 2019/0164710 A1* | 5/2019 | Fleege | .......... | H01H 50/64 |
| 2020/0182921 A1* | 6/2020 | Jakupi | ......... | G01R 15/202 |

* cited by examiner

OPENING AND CLOSING MECHANISM AND LEAKAGE PROTECTION DEVICE

FIELD

The present disclosure relates to the field of electrical equipment, and more specifically, to an opening and closing mechanism and a leakage protection device comprising the same.

BACKGROUND

Leakage protection devices, such as Ground Fault Circuit Interrupter (GFCI) or Residual Current Device (RCD), can detect leakage and rapidly cut off the power supply when the leakage occurs, so as to protect safety of the personnel and the load. The leakage protection devices usually include an opening and closing mechanism for cutting off the power supply or breaking the currents. The opening and closing mechanism may execute opening and closing operations. Once detecting leakage, the leakage protection device may indicate the opening and closing mechanism to perform an opening operation, to disconnect the load from the power supply. After the leakage is resolved, the opening and closing mechanism may execute a closing operation, allowing the power supply to continue to supply power to the load.

Existing opening and closing mechanisms have various issues. For example, the opening speed of the opening and closing mechanism is slow, and the internal transmission structure of the opening and closing mechanism is complicated and low-efficient etc. The above issues impact performance and efficiency of the opening and closing mechanism.

SUMMARY

To at least solve the above and other possible issues, embodiments of the present disclosure provide a new opening and closing mechanism and a leakage protection device comprising the opening and closing mechanism.

In a first aspect of the present disclosure, there is provided an opening and closing mechanism, comprising a stationary contact and a movable contact, which contacts the stationary contact at ON-position and separates from the stationary contact at OFF-position; a first magnetic assembly; and a second magnetic assembly that is integrally rotatable about an axis, the second magnetic assembly comprising: an electric conductor onto which the movable contact is mounted; and a magnetic body comprising at least one magnetic portion configured to rotate about the axis under a magnetic force from the first magnetic assembly, to correspondingly drive the movable contact to rotate between the ON-position and the OFF-position, wherein a distance from each of the at least one magnetic portion to the axis is smaller than a distance from the movable contact to the axis.

In the embodiments of the present disclosure, the integrated rotary structure drives the movable contact to move and rotation radius at the driving side of the rotary structure and the rotation radius at the side of the movable contact are appropriately configured. In such case, the transmission efficiency may be boosted, and the movable and stationary contacts are separated faster and by a longer distance, so as to improve the performance of the opening and closing mechanism.

In some implementations of the present disclosure, the electric conductor and the magnetic body of the second magnetic assembly are formed into an integral component by injection molding. In this way, possible gaps and frictions in the transmission can be effectively eliminated, to further boost the transmission efficiency.

In some implementations of the present disclosure, the at least one magnetic portion comprises a first magnetic portion and a second magnetic portion both having a first polarity, and a third magnetic portion and a fourth magnetic portion both having a second polarity opposite to the first polarity, and wherein when the movable contact is at the ON-position, the first magnetic portion and the third magnetic portion form a closed magnetic circuit with the first magnetic assembly, and when the movable contact is at the OFF-position, the second magnetic portion and the fourth magnetic portion form a closed magnetic circuit with the first magnetic assembly. In these implementations, a closed magnetic circuit is formed, which may reduce leakage of the magnetic flux and promote the efficiency for converting the electromagnetic energy to kinetic energy. In addition, the closed magnetic circuit may generate a greater electromagnetic force than the open magnetic circuit.

In some implementations of the present disclosure, the first magnetic assembly comprises a magnetizer and an electromagnetic coil wound around the magnetizer, the electromagnetic coil being configured to introduce two currents in different directions, and wherein the first magnetic portion and the fourth magnetic portion are arranged adjacent to a first pole of the magnetizer, and the second magnetic portion and the third magnetic portion are arranged adjacent to a second pole of the magnetizer, the first pole and the second pole having opposite polarity. In the implementations, the interaction force between all magnetic portions and the first magnetic assembly is fully utilized and a closed magnetic circuit is also formed, to more rapidly drive the movable contact to rotate.

In some implementations of the present disclosure, the second magnetic assembly comprises a first support and a rotation shaft disposed along the axis, wherein the electric conductor and the magnetic body are fixed to the first support, and the first support is connected to the rotation shaft to rotate around the axis. In these implementations, when the electric conductor and the magnetic body are fixed by the first support to form an integrated component, the influence of the gaps and frictions between the components on the transmission is greatly reduced.

In some implementations of the present disclosure, the first magnetic assembly comprises a second support, wherein the second support is fixed to the magnetizer and the rotation shaft is rotatably connected to the second support. In these implementations, the first magnetic assembly and the second magnetic assembly are arranged in a more compact manner, to downsize the overall volume of the opening and closing mechanism.

In some implementations of the present disclosure, the magnetic body comprises a permanent magnet magnetically coupled to the at least one magnetic portion made of magnetically conductive materials. In the implementations, the magnetic body of the second magnetic assembly in need of rotation is formed via a simple, reliable and low-cost approach.

In some implementations of the present disclosure, the electric conductor comprises an elastic copper sheet. These implementations may reduce the electromagnetic power required for rotating the movable contact in the breaking operation and downsize the volume of the magnetizer or iron core in the first magnetic assembly.

In some implementations of the present disclosure, a U-shaped protrusion or a slot is formed on the elastic copper sheet. The U-shaped protrusion and slot may increase elasticity of the elastic copper sheet. In addition, due to the U-shaped protrusion, the elastic copper sheet gains a greater flexibility of the length and may be applied to a wider range. Moreover, the arrangement of the slot reduces the materials to be used, i.e., the costs are further lowered.

In some implementations of the present disclosure, the opening and closing mechanism further comprises: an elastic piece disposed adjacent to the first magnetic portion, the elastic piece being configured to press the first magnetic portion towards the ON-position when the movable contact is at the OFF-position, and to separate from the first magnetic portion when the movable contact is at the ON-position. In this way, the electromagnetic power required for rotating the movable contact in the closing operation is reduced and the volume of the magnetizer or iron core in the first magnetic assembly is downsized.

In a second aspect of the present disclosure, there is provided a leakage protection device, comprising: the opening and closing mechanism according to the first aspect. The advantageous effects obtained by the first aspect also apply to the second aspect.

In some implementations of the present disclosure, the leakage protection device comprises: a control unit coupled to the first magnetic assembly and configured to switch on and off the opening and closing mechanism by controlling the first magnetic assembly, and a communication unit coupled to the control unit, the communication unit being configured to communicate with an external device. In these implementations, the operating staff may remotely operate the leakage protection device. Accordingly, the operating staff may safely and conveniently operate the leakage protection device.

In a third aspect of the present disclosure, there is provided an electrical apparatus, comprising the opening and closing mechanism of the first aspect. The advantageous effects obtained by the first aspect also apply to the third aspect.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Through the following more detailed description of the example embodiments of the present disclosure with reference to the accompanying drawings, the above and other objectives, features, and advantages of the present disclosure will become more apparent, wherein the same reference sign usually refers to the same component in the example embodiments of the present disclosure.

DETAILED DESCRIPTION OF EMBODIMENTS

The embodiments of the present disclosure will be described in more details with reference to the drawings. Although the drawings illustrate the embodiments of the present disclosure, it should be appreciated that the present disclosure can be implemented in various manners and should not be limited to the embodiments explained herein. On the contrary, the embodiments are provided to make the present disclosure more thorough and complete and to fully convey the scope of the present disclosure to those skilled in the art. Those skilled in the art may obtain an alternative technical solution from the following description without deviating from the spirit and the protection scope of the present disclosure.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The terms "one example embodiment" and "one embodiment" are to be read as "at least one example embodiment." The following text also can include other explicit and implicit definitions.

Embodiments of the present disclosure provide a novel opening and closing mechanism and a leakage protection device comprising the opening and closing mechanism. Within the opening and closing mechanism or the leakage protection device, a magnetic assembly that drives a movable contact to move is an integrated rotary structure, to effect an efficient gapless transmission with small friction. In addition, greater separation velocity and wider distance may be obtained between a movable contact and a stationary contact by appropriately setting radius of rotation at a driving side and radius rotation at a driven side. This improved opening and closing mechanism can effectively promote efficiency of breaking and connecting operations and the overall performance.

Figure 1:
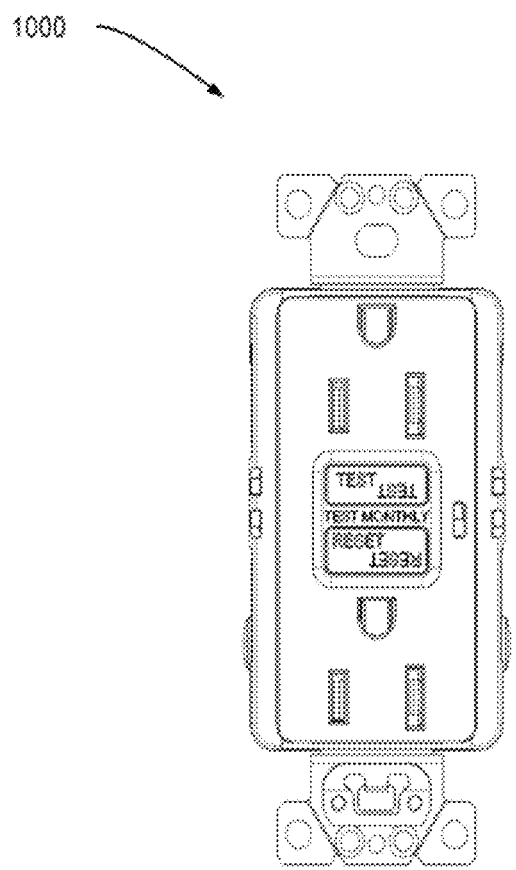
FIG. 1 illustrates a leakage protection device in accordance with embodiments of the present disclosure.

FIG. 1 illustrates a leakage protection device 1000 in accordance with embodiments of the present disclosure. As an example, the leakage protection device 100 may be Ground Fault Circuit Interrupter (GFCI) or Residual Current Device (RCD). However, it is to be understood that the leakage protection device 100 is not limited to this and instead may be any other devices that fulfill leakage protection purpose.

Figure 2:
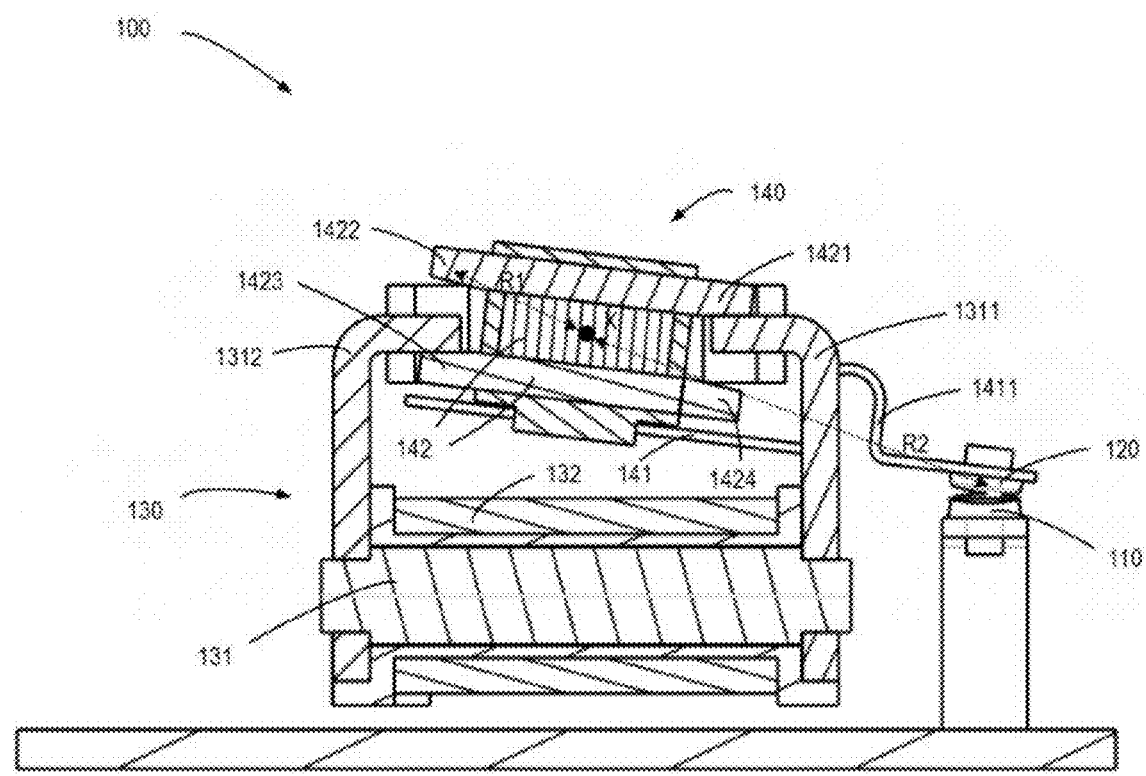
FIG. 2 illustrates a section view of the opening and closing mechanism in accordance with embodiments of the present disclosure.
Figure 3A:
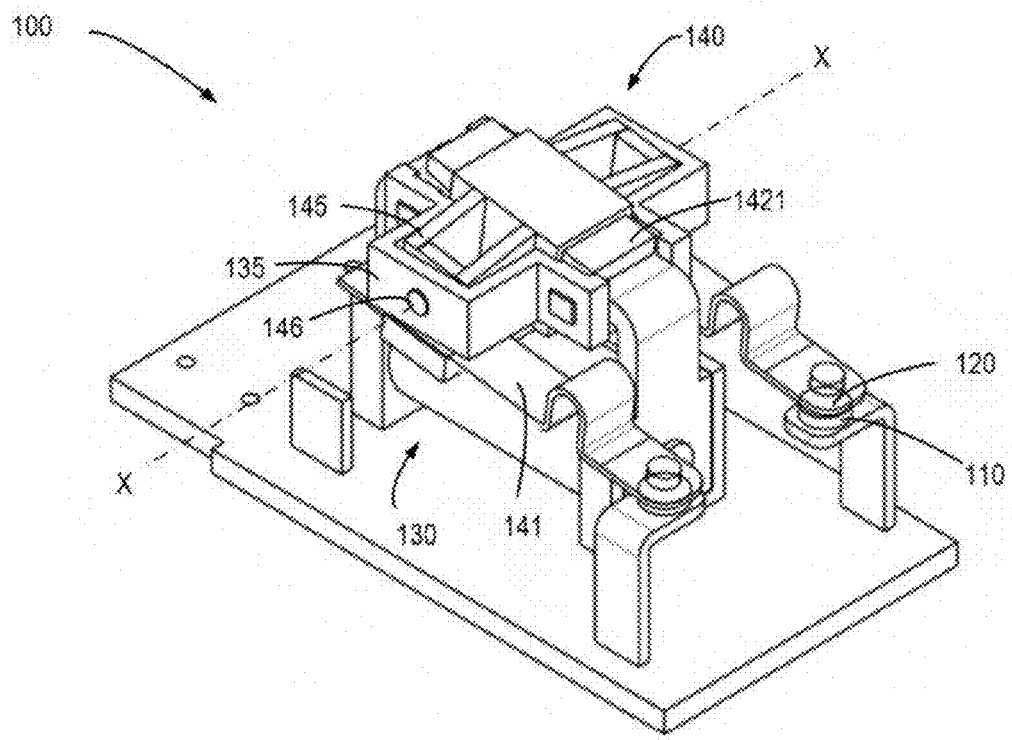
FIG. 3A illustrates a perspective view of the ON-state opening and closing mechanism in accordance with embodiments of the present disclosure.
Figure 3B:
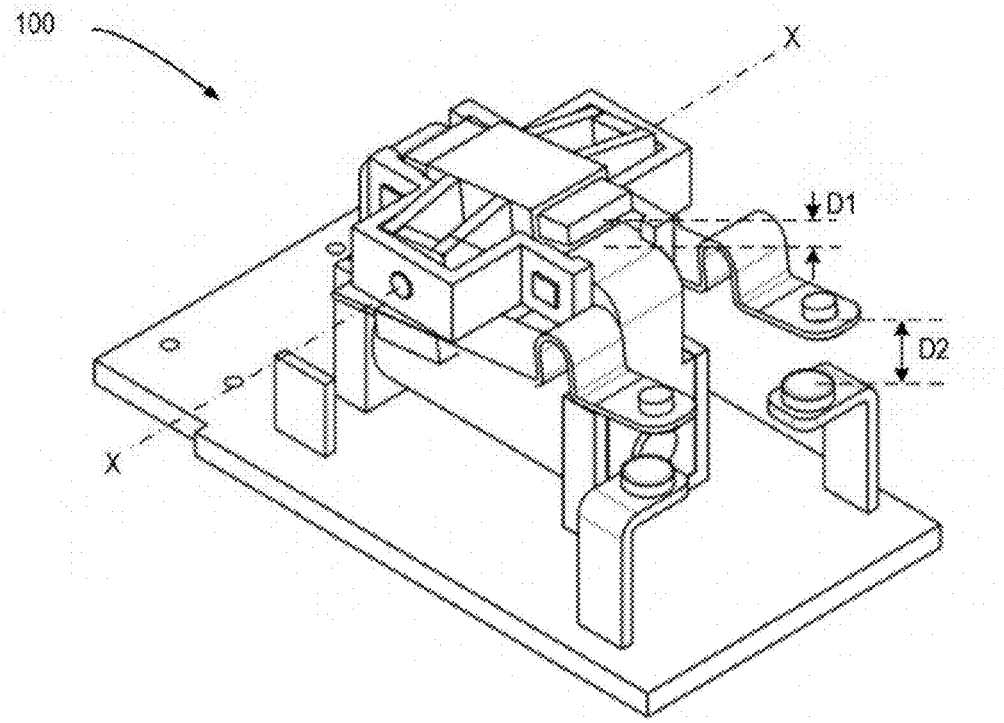
FIG. 3B illustrates a perspective view of the OFF-state opening and closing mechanism in accordance with embodiments of the present disclosure.

FIG. 2 illustrates a section view of the opening and closing mechanism 100 in accordance with embodiments of the present disclosure; FIG. 3A illustrates a perspective view of the ON-state opening and closing mechanism 100 in accordance with embodiments of the present disclosure; and FIG. 3B illustrates a perspective view of the OFF-state opening and closing mechanism 100 in accordance with embodiments of the present disclosure. The opening and closing mechanism 100 may be disposed in the leakage protection device 1000 in FIG. 1. However, the present disclosure is not restricted to this. The opening and closing mechanism 100 may also be disposed in any other devices that fulfill the protection purpose by engaging or disengaging the contact. For example, the opening and closing mechanism 100 may be arranged in electricity meter, small-scale circuit breaker or Miniature Circuit Breaker (MCB), Molded Case Circuit Breaker (MCCB), socket or other types of electromagnetic switches (e.g., relay).

In accordance with embodiments of the present disclosure, the opening and closing mechanism 100 may include a stationary contact 110 and a movable contact 120, which contacts the stationary contact 110 at an ON-position (as shown in FIG. 3A) and is separated from the stationary contact 110 at an OFF-position (as shown in FIG. 3B). As an example, the opening and closing mechanism 100 may be connected in a main circuit between a power supply and a load. The stationary contact 110 may be used for a circuit in the main circuit connected to the power supply. Correspondingly, the movable contact 120 may be used for a circuit in the main circuit connected to the load, and vice versa. The movable contact 120 is capable of performing a moving operation, so that the movable contact 120 may move between the ON-position where it makes contact with the stationary contact 110 and the OFF-position where it separates from the stationary contact 110, so as to connect or disconnect the main circuit as a function of the indication.

In accordance with embodiments of the present disclosure, the opening and closing mechanism 100 may include a first magnetic assembly 130 and a second magnetic assembly 140. As an example, the first magnetic assembly 130 and the second magnetic assembly 140 may be independent of each other. The first magnetic assembly 130 and the second magnetic assembly 140 may include an essential element for producing or transmitting magnetic flux, e.g., a permanent magnet comprised of magnetized hard magnetic materials, an iron core or magnetizer consisting of soft magnetic materials, and a coil wound around the iron core or the magnetizer etc.

Figure 4:
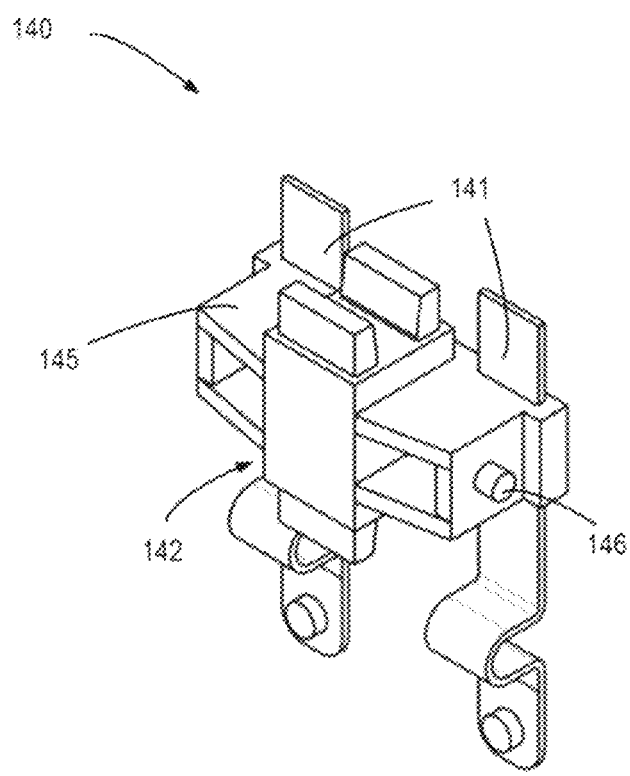
FIG. 4 illustrates a perspective view of the second magnetic assembly in accordance with embodiments of the present disclosure.
Figure 5A:
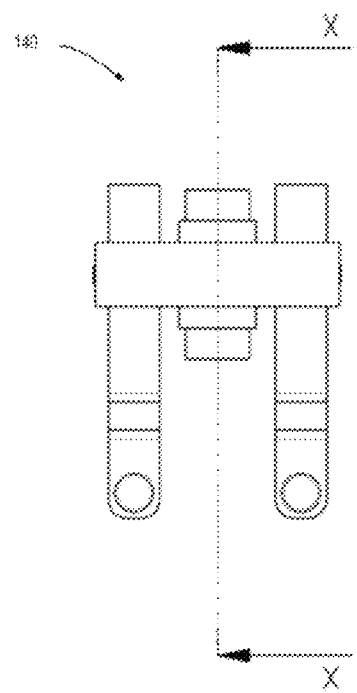
FIG. 5A illustrates a front view of the second magnetic assembly in accordance with embodiments of the present disclosure.
Figure 5B:
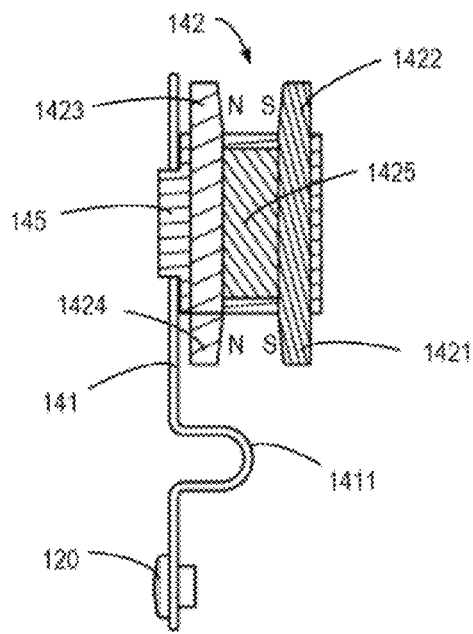
FIG. 5B illustrates a section view of the second magnetic assembly in accordance with embodiments of the present disclosure.

An exemplary structure of the second magnetic assembly 140 is further described below with reference to FIGS. 4, 5A and 5B on the basis of FIGS. 2, 3A and 3B. FIG. 4 illustrates a perspective view of the second magnetic assembly 140 in accordance with embodiments of the present disclosure; FIG. 5A illustrates a front view of the second magnetic assembly 140 and FIG. 5B illustrates a section view of the second magnetic assembly 140. In accordance with embodiments of the present disclosure, the second magnetic assembly 140 can integrally rotate about X-axis. The second magnetic assembly 140 includes an electric conductor 141, on to which the movable contact 120 is mounted. As an example, the second magnetic assembly 140 as a whole can rotate about the X-axis, to drive the rotation of the electric conductor 141. In comparison to other transmission structures, e.g., multi-level transmission structures or rotational-to-linear motion transmission structures, the integrated rotary structure can more efficiently transmit power and avoid frictions and gaps between various components of the transmission structure. As the movable contact 120 is mounted on the electric conductor 141, the rotation of the second magnetic assembly 140 will correspondingly drive the movable contact 120 on the electric conductor 141 to rotate. For example, the movable contact 120 may be mounted at one end of the electric conductor 141, and the other end of the electric conductor 141 is connected to the main circuit. Accordingly, in case of the movable contact 120 contacting the stationary contact 110, the electric conductor 141 may transmit supply power from the stationary contact 110 to post-stage loads, or to post-stage loads at the side of the stationary contact.

In accordance with embodiments of the present disclosure, the second magnetic assembly 140 further include a magnetic body 142, wherein the magnetic body 142 consists of at least one magnetic portion 1421, 1422, 1423, 1424 configured to rotate about the X-axis under the magnetic action from the first magnetic assembly 130, to correspondingly drive the movable contact 120 to rotate between the ON-position and the OFF-position. A distance R1 from each of the at least one magnetic portion 1421, 1422, 1423, 1424 to the X-axis is smaller than a distance R2 from the movable contact 120 to the X-axis. The number of magnetic portions is not restricted to the amount shown in the drawings. Instead, any suitable numbers of magnetic portions may be provided as required. The magnetic portion 1421, 1422, 1423, 1424 may be affected by the magnetic force of the first magnetic assembly 130 and rotate about the X-axis under the action of the magnetic force, thereby driving the movable contact 120 to rotate about the X-axis. If a distance R1 from any of the magnetic portion 1421, 1422, 1423, 1424 to the X-axis (only distance R1 from the magnetic portion 1422 to the X-axis is shown as an example) is smaller than a distance from the movable contact 120 to the X-axis, it means that a radius of the rotating track of any magnetic portion is smaller than a radius of the rotating track of the movable contact 120. As a result, a greater linear velocity is generated to separate the movable contact 120 from the stationary contact 110, and the rotation of the movable contact 120 may span a longer distance. For example, as shown in FIG. 3B, when the magnetic portion rotates for a distance D1, the stationary contact 110 and the movable contact 120 may be spaced apart for a longer distance D2. On account of a longer breaking distance and a greater breaking velocity, the stationary contact 110 is quickly and efficiently separated from the movable contact 120 and arcs that may possibly be generated between the stationary contact 110 and the movable contact are extinguished, thereby cutting off the main circuit and further improving the shutoff performance of the opening and closing mechanism.

In some embodiments of the present disclosure, the electric conductor 141 and the magnetic body 142 of the second magnetic assembly 140 are formed into an integrated component by injection molding. As an example, the electric conductor 141 and the magnetic body 142 are formed into one piece by injection molding. Accordingly, the electric conductor 141 and the magnetic body 142 are stably integrated by injection molding materials, to effectively eliminate possible gaps and frictions in the transmission. These gaps and frictions are adverse factors that lower the transmission efficiency. When the magnetic portion of the magnetic body 142 is driven by the magnetic force to rotate, the driving force may be more efficiently transmitted to the movable contact 120.

In some embodiments of the present disclosure, for example in FIGS. 4 and 5B, the magnetic body 142 includes a permanent magnet 1425 magnetically coupled to at least one magnetic portion 1421, 1422, 1423, 1424 made of magnetically conductive materials. As an example, each of the at least one magnetic portion 1421, 1422, 1423, 1424 may be a part of a sheet comprised of magnetically conductive materials, and the magnetic body 142 may include one or more sheets, e.g., two sheets. For example, the two sheets may be disposed at both sides of the permanent magnet 1425, i.e., S-pole side and N-pole side of the permanent magnet 1425. Therefore, the magnetic flux generated by the permanent magnet 1425 may penetrate through the at least one magnetic portion 1421, 1422, 1423, 1424, to produce a magnetic force between the at least one magnetic portion 1421, 1422, 1423, 1424 and the first magnetic assembly 130. It is to be understood that the at least one magnetic portion 1421, 1422, 1423, 1424 of the magnetic body 142 may also be composed of permanent magnets directly, or iron core or electromagnetic coil in replacement of the permanent magnet 1425. It is noted that the use of the permanent magnet 1425 will bring a big edge over other approaches. Specifically, if each magnetic portion is made of permanent magnets, it is more difficult to manufacture the second magnetic assembly 140, which accordingly increases the costs of production. In case that the iron core and the electromagnetic coil are employed, it is also required to introduce some additional assemblies, such as brush or conductive ring, to enable the rotation of the second magnetic assembly 140. In such case, the manufacturing process becomes more complicated and the reliability decreases. Hence, it is a simple, low-cost and reliable approach to use the permanent magnet 1425 as the magnetic body 142 of the second magnetic assembly 140.

Figure 6A:
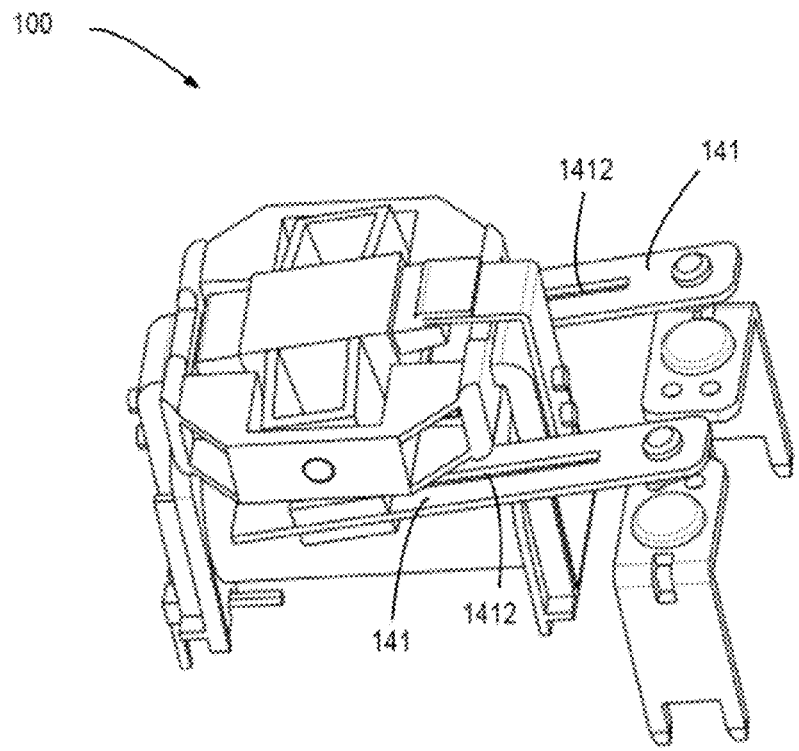
FIG. 6A illustrates a perspective view of the opening and closing mechanism in accordance with alternative embodiments of the present disclosure.
Figure 6B:
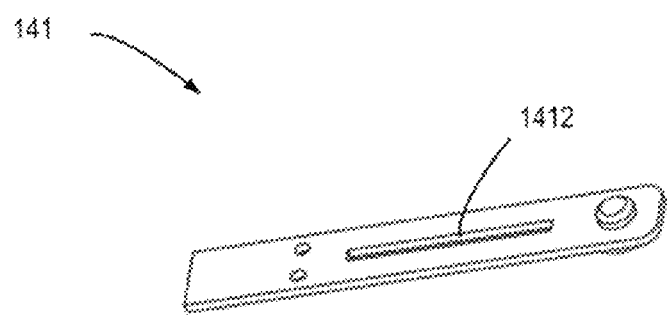
FIG. 6B illustrates a perspective view of the electric conductor in accordance with alternative embodiments of the present disclosure.

In some embodiments of the present disclosure, the electric conductor 141 of the second magnetic assembly 140 may include an elastic copper sheet, which may conduct currents at a quite low loss. In addition, the sufficient strength of the elastic copper sheet may help fixing the movable contact 120 and driving it to rotate. The elastic copper sheet also has an advantage in driving the movable contact 120 to rotate. To be specific, when the movable contact 120 is at the ON-position and it is required to separate it from the stationary contact 110, an elastic force of the elastic copper sheet may provide an auxiliary torque for the rotation of the movable contact 120, which may reduce the electromagnetic power required for rotating the movable contact in the breaking operation and downsize the volume of the magnetizer or iron core in the first magnetic assembly 130. In some embodiments of the present disclosure, a U-shaped protrusion 1411 is formed on the elastic copper sheet. As an example, the U-shaped protrusion may be positioned between an anchor point for fixing the elastic copper sheet and the movable contact 120, to increase elasticity of the elastic copper sheet. When a length of the elastic copper sheet is not suitable for the opening and closing mechanism 100, the U-shaped protrusion may adjust the length of the elastic copper sheet to gain a greater flexibility. FIGS. 6A and 6B respectively illustrate perspective views of the opening and closing mechanism 100 and the electric conductor 141 in accordance with alternative embodiments of the present disclosure. As shown in FIGS. 6A and 6B, in some embodiments of the present disclosure, a slot 1412 is formed on the elastic copper sheet serving as the electric conductor 141. As an example, the slot 1412 may be positioned on an overhanging part of the elastic copper sheet and present in an elongated shape, wherein the slot 1412 may be substantially positioned at the center of a width direction of the elastic copper sheet and extend along a length direction of the elastic copper sheet. It is to be appreciated that the position and the shape of the slot 1412 are not restricted to the above features. Instead, the slot may be formed at other suitable positions or into other appropriate shapes as needed. Advantageously, the slot 1412 may enhance elasticity of the elastic copper sheet and reduce the weight and the materials of the elastic copper. This further lowers the manufacturing costs.

In some embodiments of the present disclosure, the at least one magnetic portion 1421, 1422, 1423, 1424 includes a first magnetic portion 1421 and a second magnetic portion both having a first polarity, and a third magnetic portion 1423 and a fourth magnetic portion 1424 both having a second polarity opposite to the first polarity. When the movable contact 120 is at the ON-position, the first magnetic portion 1421 and the third magnetic portion 1423 form a closed magnetic circuit with the first magnetic assembly 130. If the movable contact 120 is at the OFF-position, the second magnetic portion 1422 and the fourth magnetic portion 1424 form a closed magnetic circuit with the first magnetic assembly 130. As an example, the magnetic body 142 may be formed into a shape similar to "I-shape", and the at least one magnetic portion 1421, 1422, 1423, 1424 is respectively located at four corners of the I-shape. For example, as illustrated in FIG. 5B, the first magnetic portion 1421 and the second magnetic portion 1422 exhibit S polarity, while the third magnetic portion 1423 and the fourth magnetic portion 1424 exhibit N polarity. Accordingly, when the first magnetic portion 1421 having S polarity and the third magnetic portion 1423 having N polarity are respectively driven by a magnetic attraction force exerted by the first magnetic assembly 130 to come near at or contact the first magnetic assembly 130 (i.e., the case shown in FIGS. 2 and 3A when the movable contact 120 is at the ON-position), the magnetic flux may pass through the first magnetic portion 1421, the third magnetic portion 1423 and the first assembly 130 to form a closed magnetic circuit. Similarly, when the second magnetic portion 1422 having S polarity and the fourth magnetic portion 1424 having N polarity are respectively driven by a magnetic attraction force exerted by the first magnetic assembly 130 to come near at or contact the first magnetic assembly 130 (i.e., the case shown in FIG. 3B when the movable contact 120 is at the OFF-position), the magnetic flux may pass through the second magnetic portion 1422, the fourth magnetic portion 1424 and the first assembly 130 to form a closed magnetic circuit. It is to be understood that the first magnetic portion 1421 and the second magnetic portion 1422 may have N polarity, while the third magnetic portion 1423 and the fourth magnetic portion 1424 may exhibit S polarity in other embodiments. In such case, embodiments of the present disclose may still be implemented. During the magnetic interaction between the first magnetic assembly 130 and the second magnetic assembly 140, if it is ensured that a closed magnetic circuit is formed, leakage of the magnetic flux may be reduced, so as to promote the efficiency for converting the electromagnetic energy to kinetic energy. The closed magnetic circuit may generate a greater electromagnetic force than the open magnetic circuit. In such case, a sufficient power may be provided to drive the magnetic portion of the magnetic body 142 to rotate, thereby separating the movable contact and the stationary contact. Particularly, when the distance from the magnetic portion 1421, 1422, 1423, 1424 to the X-axis is smaller than the distance from the movable contact 120 to the X-axis, the movable contact is rotated only when the magnetic force tolerated by the magnetic portion is larger than the force that prevents the movable contact 120 from moving. Therefore, a greater electromagnetic force may be provided by the closed magnetic circuit structure to move the movable contact 120 to implement shutoff operation and breaking operation.

In some embodiments of the present disclosure, the first magnetic assembly 130, as shown in FIG. 2, includes a magnetizer 131 and an electromagnetic coil 132 wound around the magnetizer 131, the electromagnetic coil 132 being configured to introduce two currents in different directions. The first magnetic portion 1421 and the fourth magnetic portion 1424 are disposed as a first pole 1311 adjacent to the magnetizer 131, and the second magnetic portion 1422 and the third magnetic portion 1423 are arranged as a second pole 1312 adjacent to the magnetizer 131. The first pole 1311 and the second pole 1312 have opposite polarity. As an example, forward DC currents and reverse DC currents may be passed into the electromagnetic coil 132, to generate two magnetic fields having different magnetic flux directions in the magnetizer 131. For example, the electromagnetic coil 132 may include a single winding, into which forward currents or inverse currents may be introduced by appropriate control operations. Alternatively, the electromagnetic coil 132 may include forward winding and reverse winding, wherein forward currents are passed into the forward winding and reverse currents are introduced into the reverse winding. When forward currents are introduced into the electromagnetic coil 132, the first pole 1311 of the magnetizer 131 adjacent to the first magnetic portion 1421 and the fourth magnetic portion 1424 has N polarity, i.e., the magnetic flux outflows from the first pole 1311, goes into the first magnetic portion 1421 and reaches the S pole of the permanent magnet 1425. Accordingly, a magnetic attraction force exists between the first magnetic portion 1421 and the first pole 1311, and a magnetic repulsion force is present between the fourth magnetic portion 1424 and the first pole 1311. The first magnetic portion 1421 and the fourth magnetic portion 1424 rotate clockwise. Meanwhile, the second pole 1312 of the magnetizer 131 adjacent to the second magnetic portion 1422 and the third magnetic portion 1423 exhibits S polarity, i.e., the magnetic flux starts from the N pole of the permanent magnet 1425, outflows from the third magnetic portion 1423 and enters the second pole 1312. Accordingly, a magnetic repulsion force is present between the second magnetic portion 1422 and the second pole 1312, and a magnetic attraction force exists between the third magnetic portion 1423 and the second pole 1312. The second magnetic portion 1422 and the third magnetic portion 1423 rotate clockwise. On the other hand, when reverse currents are introduced into the electromagnetic coil 132, the first pole 1311 of the magnetizer 131 adjacent to the first magnetic portion 1421 and the fourth magnetic portion 1424 has S polarity, i.e., the magnetic flux starts from the N pole of the permanent magnet 1425, outflows from the fourth magnetic portion 1424 and goes into the first pole 1312. Accordingly, a magnetic repulsion force exists between the first magnetic portion 1421 and the first pole 1311, and a magnetic attraction force is present between the fourth magnetic portion 1424 and the first pole 1311. The first magnetic portion 1421 and the fourth magnetic portion 1424 rotate counter-clockwise. Meanwhile, the second pole 1312 of the magnetizer 131 adjacent to the second magnetic portion 1422 and the third magnetic portion 1423 exhibits N polarity, i.e., the magnetic flux outflows from the second pole 1312, goes into the second magnetic portion 1422 and reaches the S pole of the permanent magnet 1425. Accordingly, a magnetic attraction force is present between the second magnetic portion 1422 and the second pole 1312, and a magnetic repulsion force exists between the third magnetic portion 1423 and the second pole 1312. The second magnetic portion 1422 and the third magnetic portion 1423 rotate counter-clockwise.

In this approach, by controlling the current direction of the electromagnetic coil, the four magnetic portions 1421, 1422, 1423 and 1423 may be simultaneously driven to rotate clockwise, so as to drive the movable contact 120 to rotate to the ON-position where it contacts the stationary contact 110. Alternatively, the four magnetic portions 1421, 1422, 1423 and 1423 may be simultaneously driven to rotate counter-clockwise, so as to drive the movable contact 120 to rotate to the OFF-position where it leaves from the stationary contact 110. In the above approach, the interaction force between all magnetic portions of the magnetic body 142 and the magnetic assembly 130 is fully utilized, to rapidly and effectively drive the second magnetic assembly 140 to rotate.

Figure 7:
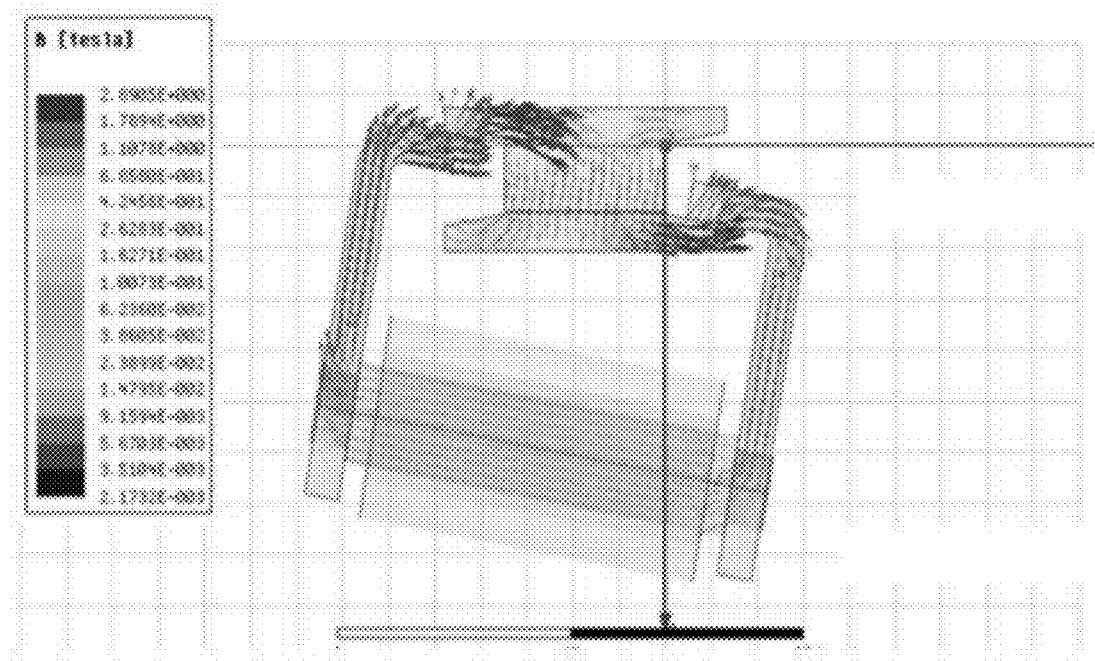
FIG. 7 illustrates an analysis chart of magnetic field simulation of the magnetic body of the first magnetic assembly and the second magnetic assembly.

Moreover, FIG. 7 illustrates an analysis chart of magnetic field simulation of the magnetic body 142 of the first magnetic assembly 130 and the second magnetic assembly 140. It is known from the chart that the two magnetic portions at diagonal positions of the magnetic body 142, the permanent magnet 1425 and the magnetizer 131 (including its body and two poles 1311 and 1312) form a closed magnetic circuit, to take full advantage of the electromagnetic force and the permanent magnetic force.

In some embodiments of the present disclosure, as shown in FIGS. 3A and 4A, the second magnetic assembly 140 includes a first support 145 and a rotation shaft 146 disposed along the X-axis. The electric conductor 141 and the magnetic body 142 are fixed on the first support 145, which first support 145 is connected to the rotation shaft 146 to rotate about the X-axis. As an example, with reference to FIG. 4, the first support 145 is formed on the electric conductor 141 and the magnetic body 142 by injection molding or molding, and the rotation shaft 146 may be formed integrally with the first support 145, to minimize the influence of the gap and the friction between the components on the rotation transmission. Alternatively, the electric conductor 141, the magnetic body 142, the first support 145 and the rotation shaft 146 also may be connected and fixed by other suitable ways as long as they are integrated in a tight and basically gap-free manner.

Figure 8:
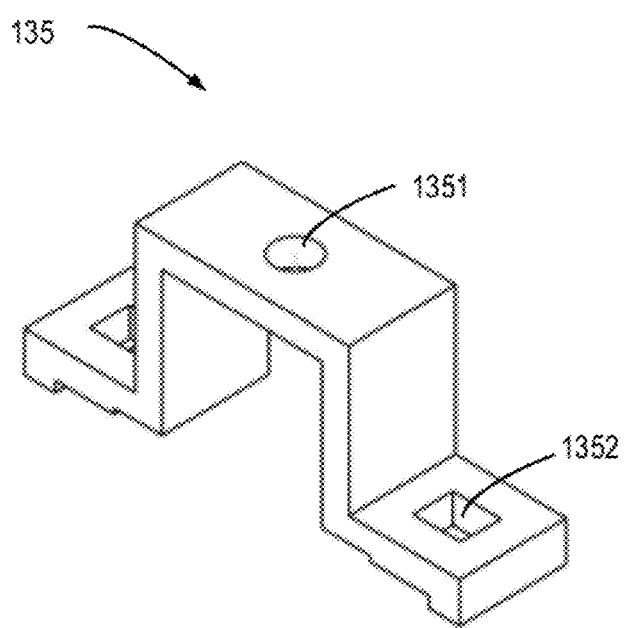
FIG. 8 illustrates a perspective view of the second support in the first magnetic assembly in accordance with embodiments of the present disclosure.

In some embodiments of the present disclosure, the first magnetic assembly 130 includes a second support 135 as shown in FIG. 3A. The second support 135 is fixed to the magnetizer 131 and the rotation shaft 146 is rotatably connected to the second support 135. As an example, FIG. 8 illustrates a perspective view of the second support 135 in accordance with embodiments of the present disclosure. According to FIG. 8, a rotation shaft hole 1351 and a mounting hole 1352 are formed on the second support 135. The second support 135 may be mounted to the first pole 1311 and the second pole 1312 of the magnetizer 131 by the mating between the fastening elements and the mounting hole 1352. Alternatively, the second support 135 also may be mounted at other suitable positions, e.g., housing of the opening and closing mechanism 100, as long as the second support 135 can be fixed relative to the first magnetic assembly 130 and adjacent to the second magnetic assembly 140. However, the second support 135 is preferably fixed to the magnetizer 131, such that the two magnetic assemblies of the opening and closing mechanism 100 are more compact and have small volumes. In addition, the rotation shaft 146 may be mounted in the rotation shaft hole 1351 of the second support 135. In such case, the second support 135 may support the second magnetic assembly 140 in a vertical direction, and the second magnetic assembly 140 may rotate as a whole with respect to the second support 135 and the first magnetic assembly 130.

Figure 9A:
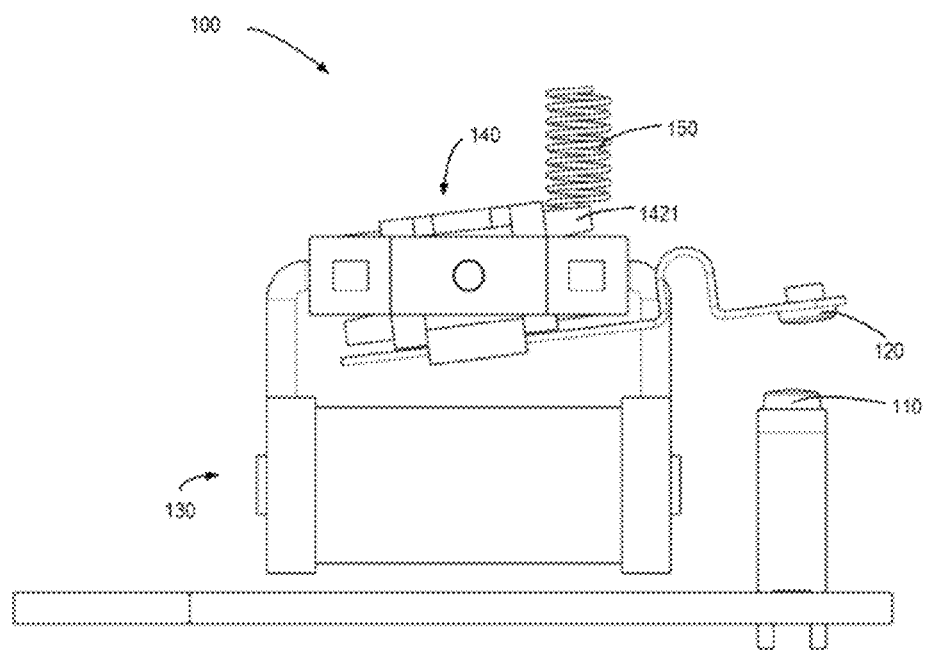
FIG. 9A illustrates a front view of the OFF-state opening and closing mechanism in accordance with alternative embodiments of the present disclosure.
Figure 9B:
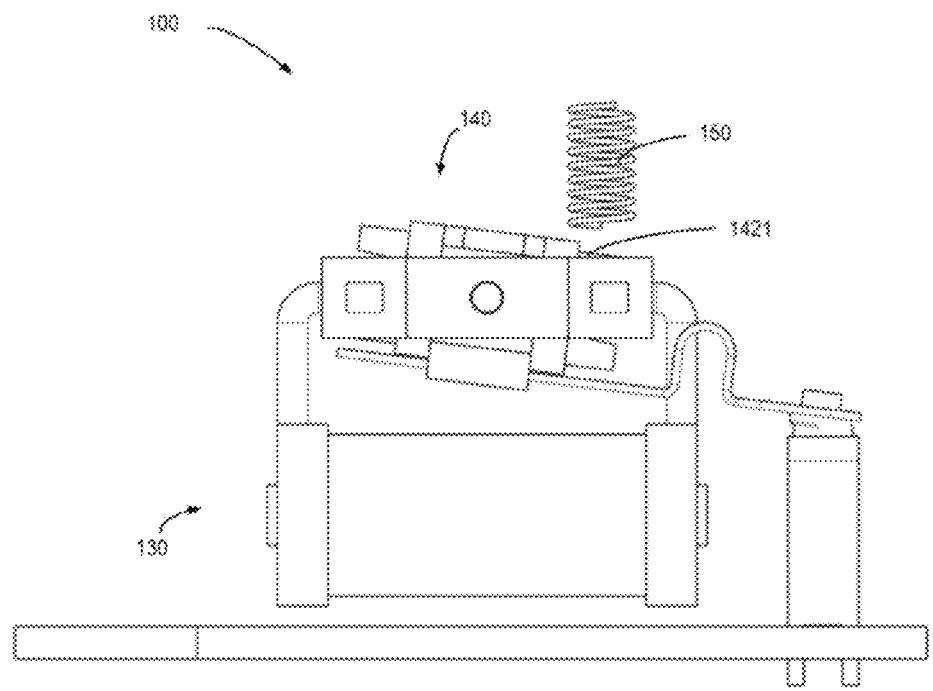
FIG. 9B illustrates a front view of the ON-state opening and closing mechanism in accordance with alternative embodiments of the present disclosure.

FIG. 9A illustrates a front view of the OFF-state opening and closing mechanism 100 in accordance with alternative embodiments of the present disclosure, and FIG. 9B illustrates a front view of the ON-state opening and closing mechanism 100 in accordance with alternative embodiments of the present disclosure. In some embodiments of the present disclosure, the opening and closing mechanism 100 also may include an elastic piece 150 arranged close to the first magnetic portion 1421. The elastic piece 150 is configured to press the first magnetic portion 1421 towards the ON-position when the movable contact 120 is located at the OFF-position, and to separate the first magnetic portion 1421 when the movable contact 120 is located at the ON-position. As an example, one end of the elastic piece 150, for example, may be connected and fixed to the housing of the opening and closing mechanism 100 or other components fixed relative to the housing. As shown in FIG. 9A, when the opening and closing mechanism 100 is in the OFF-state (i.e., the movable contact 120 at the OFF-position), the elastic piece 150 close to the first magnetic portion 1421 will press the first magnetic portion 1421. In this way, when the movable contact 120 needs to rotate from the OFF-position to the ON-position with respect to the stationary contact 110, the elastic piece 150 may provide an auxiliary torque to assist the movable contact 120 completing the rotation. As a result, the electromagnetic power required for rotating the movable contact is reduced and the volume of the electric conductor or the iron core of the first magnetic assembly 130 is downsized. While the movable contact 120 is rotating from the OFF-position to the ON-position, the elastic piece 150 is separated from the first magnetic portion 1421. For example, when the movable contact 120 is at one-third of the rotation course from the OFF-position to the ON-position, the elastic piece 150 is completely separated from the first magnetic portion 1421. Therefore, as demonstrated by FIG. 9B, when the opening and closing mechanism 100 is in the ON-state (i.e., the movable contact 120 is at the ON-position), the elastic piece 150 is disengaged from the contact with the first magnetic portion 1421 and kept at a distance from the first magnetic portion 1421. Consequently, an error connection of the opening and closing mechanism 100 caused by elastic force exerted by the elastic piece 150 is avoided while an auxiliary rotation torque is still provided by the elastic piece 150. In FIGS. 9A and 9B, the elastic piece 150 is illustrated as a coil spring as an example. However, implementations of the elastic piece 150 are not restricted to this. Instead, other types of elastic components are also feasible as long as they can fulfill bias, such as leaf spring or rubber-made elastomer etc.

In the embodiments of the present disclosure, owing to the integrated rotary structure and suitable configurations of rotation radius of the magnetic portions and the movable contact, the transmission efficiency may be boosted, and the movable and stationary contacts are separated faster and by a longer distance, so as to improve the performance of the opening and closing mechanism.

Figure 10:
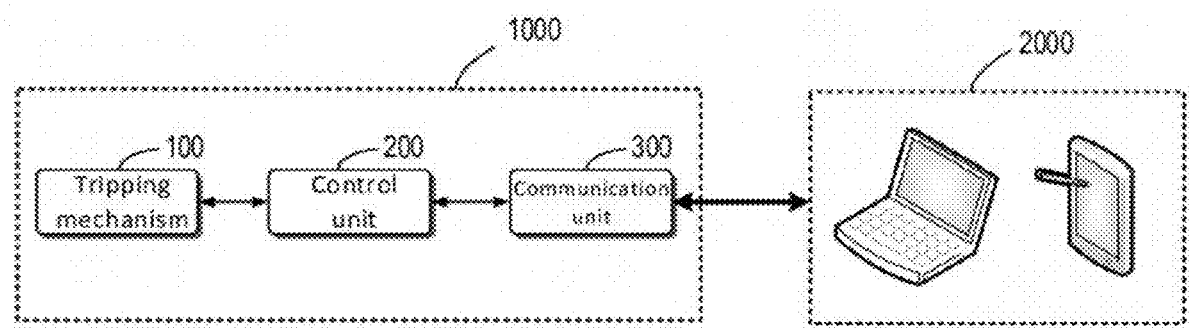
FIG. 10 illustrates a schematic diagram of the leakage protection device communicating with an external device in accordance with embodiments of the present disclosure.

FIG. 10 illustrates a schematic diagram of the leakage protection device 1000 communicating with an external device 2000 in accordance with embodiments of the present disclosure. In some embodiments of the present disclosure, the leakage protection device 1000 may include a control unit 200 in addition to the opening and closing mechanism 100 as shown in FIG. 10. The control unit 200 is coupled to the first magnetic assembly 130 of the opening and closing mechanism 100 and configured to control ON and OFF of the opening and closing mechanism 100 via the first magnetic assembly 130. As an example, the control unit 200 may include suitable power supply circuits and control circuits to control the first magnetic assembly 130. For example, the opening and closing mechanism 100 is switched on and off by controlling directions and magnitudes of the currents in the electromagnetic coil 132 of the first magnetic assembly 130.

Furthermore, the leakage protection device 1000 also may include a communication unit 300 coupled to the control unit 200 and configured to communication with an external device 2000. As an example, the external device 2000, such as smartphone, tablet computer, notebook computer and desktop computer etc., may communicate with a communication unit 300 of the leakage protection device 100 in a wired or wireless way, so as to send control instructions to the communication unit 300. The communication unit 300 may transmit the received control instructions to the control unit 200, enabling the control unit 200 to connect and disconnect the opening and closing mechanism 100 in accordance with the control instructions from the external device 200. Besides, the communication unit 300 also may send state information of the opening and closing mechanism 100 to the external device 2000, which is further provided to operating staff. In this way, the operating staff may remotely operate the leakage protection device 1000 via the external device 2000, to switch on or off the opening and closing mechanism 100. As such, the operating staff may conveniently control the leakage protection device 1000. It is to be understood that in addition to remote operation, the leakage protection device 1000 also may be operated locally to directly connect or disconnect the opening and closing mechanism 100. Here, location operation, for example, includes manual or hand operation, or operation via local electric control components.

In accordance with a further embodiment of the present disclosure, there is provided an electrical apparatus, which may include the opening and closing mechanism 100. As an example, the electrical apparatus may be electricity meter, small-scale circuit breaker or Miniature Circuit Breaker (MCB), Molded Case Circuit Breaker (MCCB), socket or electromagnetic switches (e.g., relay). With the help of the opening and closing mechanism 100, the electrical apparatus can connect and disconnect electrical lines as required. It is to be appreciated that the electrical apparatus is not limited to this. Instead, any electrical devices that can fulfill the particular function via closing or opening operations are feasible.

Through the above description and teachings provided in the related drawings, many modifications and other implementations of the present disclosure disclosed herein will be conceived by those skilled in the field related to the present disclosure. It is to be understood that the implementations of the present disclosure are not limited to the specific implementations disclosed herein, and the modifications and other implementations are included within the scope of the present disclosure. Besides, although the example implementations have been described in the context of some example combinations of the components and/or functions with reference to the related drawings, it should be recognized that different combinations of the components and/or functions may be provided by alternative implementations without deviating from the scope of the present disclosure. As far as this is concerned, other combinations of components and/or functions distinct from the above clearly described ones are also expected to fall within the scope of the present disclosure. Although specific terms are used here, they only convey generic and descriptive meanings and are not intended as restrictions.

We claim:

1. An opening and closing mechanism, comprising:
   a stationary contact and a movable contact, which contacts the stationary contact at ON-position and separates from the stationary contact at OFF-position;
   a first magnetic assembly; and
   a second magnetic assembly that is integrally rotatable about an axis, the second magnetic assembly comprising:
      an electric conductor onto which the movable contact is mounted; and
      a magnetic body comprising at least one magnetic portion configured to rotate about the axis under a magnetic force from the first magnetic assembly, to correspondingly drive the movable contact to rotate between the ON-position and the OFF-position, wherein a distance from each of the at least one magnetic portion to the axis is smaller than a distance from the movable contact to the axis.

2. The opening and closing mechanism of claim 1, wherein the electric conductor and the magnetic body of the second magnetic assembly are formed into an integral component by injection molding.

3. The opening and closing mechanism of claim 1, wherein the at least one magnetic portion comprises a first magnetic portion and a second magnetic portion both having a first polarity, and a third magnetic portion and a fourth magnetic portion both having a second polarity opposite to the first polarity, and
   wherein when the movable contact is at the ON-position, the first magnetic portion and the third magnetic portion form a closed magnetic circuit with the first magnetic assembly, and when the movable contact is at the OFF-position, the second magnetic portion and the fourth magnetic portion form a closed magnetic circuit with the first magnetic assembly.

4. The opening and closing mechanism of claim 3, wherein the first magnetic assembly comprises a magnetizer and an electromagnetic coil wound around the magnetizer, the electromagnetic coil being configured to introduce two currents in different directions, and
   wherein the first magnetic portion and the fourth magnetic portion are arranged adjacent to a first pole of the magnetizer, and the second magnetic portion and the third magnetic portion are arranged adjacent to a second pole of the magnetizer, the first pole and the second pole having opposite polarity.

5. The opening and closing mechanism of claim 4, wherein the second magnetic assembly comprises a first support and a rotation shaft disposed along the axis, wherein the electric conductor and the magnetic body are fixed to the first support, and the first support is connected to the rotation shaft to rotate around the axis.

6. The opening and closing mechanism of claim 5, wherein the first magnetic assembly comprises a second support, wherein the second support is fixed to the magnetizer and the rotation shaft is rotatably connected to the second support.

7. The opening and closing mechanism of claim 1, wherein the magnetic body comprises a permanent magnet magnetically coupled to the at least one magnetic portion made of magnetically conductive materials.

8. The opening and closing mechanism of claim 1, wherein the electric conductor comprises an elastic copper sheet.

9. The opening and closing mechanism of claim 8, wherein a U-shaped protrusion or a slot is formed on the elastic copper sheet.

10. The opening and closing mechanism of claim 3, further comprising:
    an elastic piece disposed adjacent to the first magnetic portion, the elastic piece being configured to press the first magnetic portion towards the ON-position when the movable contact is at the OFF-position, and to separate from the first magnetic portion when the movable contact is at the ON-position.

11. A leakage protection device, comprising:
    the opening and closing mechanism according to claim 1.

12. The leakage protection device of claim 11, further comprising:
    a control unit coupled to the first magnetic assembly and configured to switch on and off the opening and closing mechanism by controlling the first magnetic assembly, and
    a communication unit coupled to the control unit, the communication unit being configured to communicate with an external device.

13. An electrical apparatus, comprising the opening and closing mechanism according to claim 1.

* * * * *